(12) United States Patent
Song

(10) Patent No.: US 6,657,449 B2
(45) Date of Patent: Dec. 2, 2003

(54) TEST PIN UNIT FOR PCB TEST DEVICE AND FEEDING DEVICE OF THE SAME

(75) Inventor: Sang Ok Song, Incheon (KR)

(73) Assignee: Hansaem Digitec Co., Ltd. (KR)

( * ) Notice: Subject to any disclaimer, the term of this patent is extended or adjusted under 35 U.S.C. 154(b) by 56 days.

(21) Appl. No.: 09/903,204

(22) Filed: Jul. 11, 2001

(65) Prior Publication Data

US 2002/0079914 A1 Jun. 27, 2002

(30) Foreign Application Priority Data

Dec. 21, 2000 (KR) .......................................... 2000-79543
Dec. 21, 2000 (KR) .......................................... 2000-79544

(51) Int. Cl.$^7$ ............................................... G01R 1/073
(52) U.S. Cl. ........................................ 324/762; 324/754
(58) Field of Search ................................. 324/754, 758, 324/761, 762, 537, 538; 310/12

(56) References Cited

U.S. PATENT DOCUMENTS

| | | | |
|---|---|---|---|
| 3,857,075 A | * 12/1974 | Sawyer | 318/38 |
| 4,362,991 A | * 12/1982 | Carbine | 324/754 |
| 4,471,298 A | * 9/1984 | Frohlich | 324/72.5 |
| 4,507,598 A | * 3/1985 | Wakabayashi et al. | 318/687 |
| 4,527,119 A | * 7/1985 | Rogers et al. | 324/758 |
| 4,714,400 A | * 12/1987 | Barnett et al. | 414/751.1 |
| 5,047,714 A | * 9/1991 | Maeno et al. | 324/758 |
| 5,107,206 A | * 4/1992 | Yanagi et al. | 324/754 |
| 5,345,170 A | * 9/1994 | Schwindt et al. | 324/754 |
| 6,347,259 B1 | * 2/2002 | Goldenberg et al. | 700/218 |
| 6,424,077 B1 | * 7/2002 | Hata et al. | 310/328 |

* cited by examiner

Primary Examiner—Ernest Karlsen
(74) Attorney, Agent, or Firm—Harness, Dickey & Pierce, P.L.C.

(57) ABSTRACT

The present invention relates to a test pin unit for a PCB test device capable of applying an electrical signal to each contact point of a PCB in a PCB test device which detects a certain defect in a PCB based on an electrical connection state by applying an electrical signal to each contact point of a PCB and relates to a feeding device capable of feeding the test pin unit to a certain place on a PCB.

The test pin unit for a PCB (Printed Circuit Board) test device according to the present invention includes a body installed in the interior of a PCB test device in such a manner that the body is moved in a vertical direction on a PCB which is a tested object, a moving body which is movable in a horizontal direction with respect to the body and has a sliding surface formed at one end of the same in a vertical direction of the PCB, a first movement control means for controlling a horizontal movement with respect to the body of the moving body, a moving member slidably attached to a sliding surface of the moving body and is slidably moved toward the PCB and contacting the test pin of the end portion with a certain contact point of the PCB for thereby applying an electrical signal through the test pin, and a second movement control means for controlling the sliding movement of the moving member for thereby significantly decreasing the feeding number of the test pin units needed for a PCB test and significantly enhancing a test efficiency of the PCB test device by increasing the number of the test units which are fed at the same time.

4 Claims, 7 Drawing Sheets

TEST PIN UNIT FOR PCB TEST DEVICE AND FEEDING DEVICE OF THE SAME

BACKGROUND OF THE INVENTION

1. Field of the Invention

The present invention relates to a test pin unit for a PCB test device capable of applying an electrical signal to each contact point of a PCB in a PCB test device which detects a certain defect in a PCB based on an electrical connection state by applying an electrical signal to each contact point of a PCB and relates to a feeding device capable of feeding the test pin unit to a certain place on a PCB, and in particular to a test pin unit for a PCB test device capable of applying an electrical signal to multiple contact points at every feeding operation and a feeding device of a test pin unit capable of quickly feeding multiple test pin units at the same time.

2. Description of the Background Art

Generally, a PCB (Printed Circuit Board) is capable of printing a certain circuit on a substrate formed of a paper phenol or glass epoxy after coating a thin copper film thereon and removing the non-printed portion of the substrate based on an etching technique. Electrical parts such as IC are mounted on the surface of the substrate by a Pb welding method.

Recently, the PCB becomes light and small-sized for mounting a highly integrated part thereon based on an advanced technique and is a basic element for increasing the integrity of the electrical parts. Therefore, the importance of the same attracts a big attention. The pattern of the recently fabricated PCB becomes intensive based on the increased integrity, so that a more intensive pattern printing process is needed, so that an error possibility is increased, and it is recognized that the test is important.

The defect test of the PCB is implemented by applying an electrical signal to a certain contact point of the PCB which is a tested object for thereby checking an electrical connection state of the contact point of the PCB. Namely, the test of the PCB is performed using a PCB test device. The PCB test device includes a test pin unit having a test pin capable of contacting a certain contact point of the PCB and applying an electrical signal to the contact point and a test pin feeding device capable of feeding the test unit in a 2-axis direction with respect to the PCB. The test unit is fed to a certain place of the PCB based on a 2-axis direction movement using the feeding device and applies an electrical signal to a certain contact point which is judged to be tested using the test pin for thereby checking an electrical connection state, so that it is possible to check a defect state of the PCB.

The conventional PCB test pin unit (Korean Patent No. 262819, "Test pin driving apparatus for PCB tester" field by the same applicant of the present invention) in which the conventional PCB test device is used, includes a casing 20, a slider 30 which is slidably moved based on a magnetic force of an electrical magnet along a sliding surface 22 of the casing 20, and a test pin 6 downwardly extended from the slider 30. Therefore, the test pin which is moved to a certain place on the PCB and is driven by the slider in a vertical direction, is contacted with a certain contact point of the PCB, so that an electrical signal is applied to the contact point. The above-described conventional device is capable of decreasing a test time of the PCB test device by mounting more number of tested objects based on the small sized system.

However, in the conventional test pin unit for a PCB test device, the coordinate movement of the test pin is implemented by only the feeding device, so that the test pin must be moved to every contact point by the test pin unit feeding device which need the test. In addition, the test pin unit feeding device is additionally needed for each test pin unit, so that the mounting number of the tested objects is limited, whereby there is a limit for increasing a test efficiency of the PCB of the PCB test device.

In addition, in the case of the conventional test pin unit feeding method, since the test pin unit is moved to a certain place of the PCB by an arm which is rotated from one side of the PCB, the test pin unit contacts the test pin with a certain contact point of the PCB using a slider which is driven in a vertical direction for thereby applying an electrical signal to the contact point.

However, in the above-described conventional PCB test pin unit feeding method, the number of the arms installed in the test device is limited, and the test efficiency of the PCB of the PCB test device is significantly decreased due to a slow revolution of the arm. Namely, in the case of the conventional PCB test pin unit feeding method, the number of arms mounted in the PCB test device is limited due to an interference of the arm. In addition, each arm is capable of feeding only one test pin unit, and the number of test pin units which are moved at the same time is very small, and the test pin feeding speed is very slow due to the low revolution of the arm, so that the test efficiencies of the PCB test pin unit and the PCB test device are decreased.

SUMMARY OF THE INVENTION

Accordingly, it is an object of the present invention to provide a test pin unit for a PCB test device and a feeding device of the same which overcome the problems encountered in the conventional art.

It is another object of the present invention to provide a test pin unit for a PCB test device which is capable of feeding a test pin in a certain range with respect to a PCB and contacting a test pin with respect to a plurality of contact points at every feeding operation for thereby significantly decreasing a feeding number of a test pin unit compared to a number of contact points of the PCB which need a test.

It is another object of the present invention to provide a feeding device of a PCB test pin unit which is capable of feeding multiple test pin units with respect to a PCB which is a tested object at the same time and significantly increasing a test efficiency of a PCB test device.

To achieve the above objects, there is provided a test pin unit for a PCB test device which includes a body installed in the interior of a PCB test device in such a manner that the body is moved in a vertical direction on a PCB which is a tested object, a moving body which is movable in a horizontal direction with respect to the body and has a sliding surface formed at one end of the same in a vertical direction of the PCB, a first movement control means for controlling a horizontal movement with respect to the body of the moving body, a moving member slidably attached to a sliding surface of the moving body and is slidably moved toward the PCB and contacting the test pin of the end portion with a certain contact point of the PCB for thereby applying an electrical signal through the test pin, and a second movement control means for controlling the sliding movement of the moving member.

The first movement control means includes a plurality of permanent magnets embedded in the moving body and having magnetic poles which are alternately arranged, and a plurality of electromagnets for being operated with respect to a pulling and repelling force with respect to each permanent magnet by sequentially changing the magnetic poles and for moving the moving body.

The second movement control means includes a plurality of embedded permanent magnets arranged in a vertical direction with respect to the moving member in such a manner that the magnetic poles are alternately formed with respect to the moving member, and a plurality of electromagnets embedded in a sliding surface of the moving body to correspond with each permanent magnet of the moving member and alternately generating a pulling and repelling force with respect to each permanent magnet by sequentially changing the magnetic poles for thereby moving the moving member.

The body includes a sliding surface formed in a permanent magnet and a roller, so that the sliding surface is contacted with a vertical rail of the feeding base which is a fed in a horizontal direction of the PCB by traversing the PCB which is a tested object in the vertical direction based on a pulling force of the permanent magnet, so that the body is slidable on the feeding base in the vertical direction.

The moving body includes a roller embedded in the sliding surface for implementing a sliding movement of the moving member.

To achieve the above objects, there is provided a feeding device for a test pin unit for a PCB test device which includes a support member for forming a rail in a horizontal direction, a feeding member having a rail groove and being moved in a horizontal direction with respect to the support member in such a manner that the rail groove is inserted into the rail of the support member, a feeding means for moving the feeding based in a horizontal direction, a roller which corresponds to each electric motor and is installed at an end portion of the feeding base opposite to the electric motor, and at least test pin unit feeding belt having both ends engaged to an electric gear of the electric motor and the roller corresponding thereto and having a PCB test pin unit at an intermediate portion and being driven by the electric motor for thereby feeding the test pin unit in the vertical direction.

The electric motor, rollers and test pin unit feeding belts are provided in the feeding base by at least two sets, respectively.

The feeding base includes a rail to which the test pin unit is closely contacted for a slidable movement.

The feeding means includes a feeding motor disposed at one side of the feeding base of the support base, and a feeding belt attached to the feeding base and is drivingly connected to the feeding motor and driven by the feeding motor for thereby feeding the feeding base in the horizontal direction.

The feeding base is installed in the support based by at least two sets, and each feeding base is fed in the horizontal direction by different feeding motor and the feeding belt.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The present invention will be explained with reference to the accompanying drawings.

Figure 1:
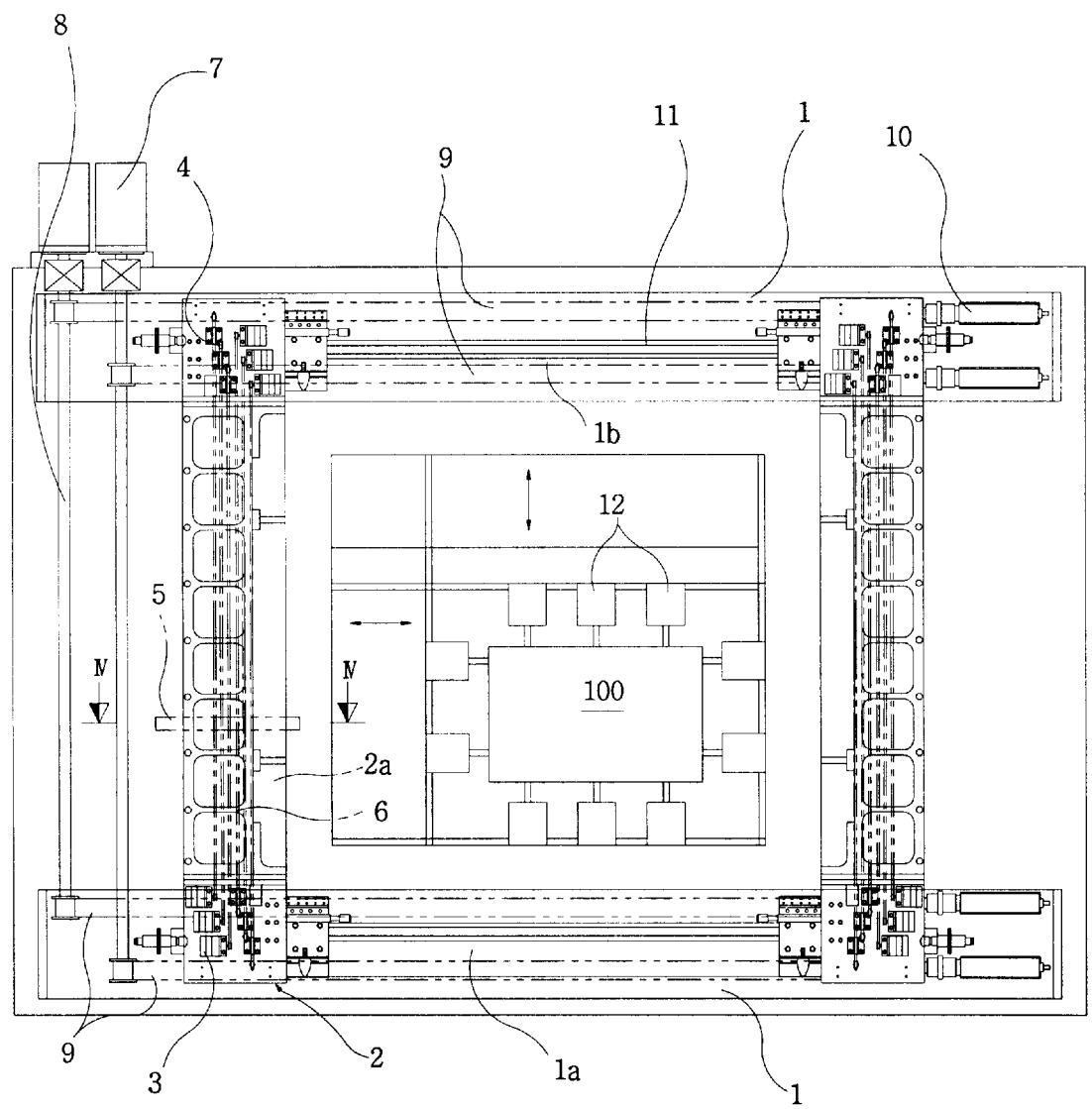
FIG. 1 is a plan view illustrating a test pin unit feeding device for a PCB test device according to an embodiment of the present invention.
Figure 2:
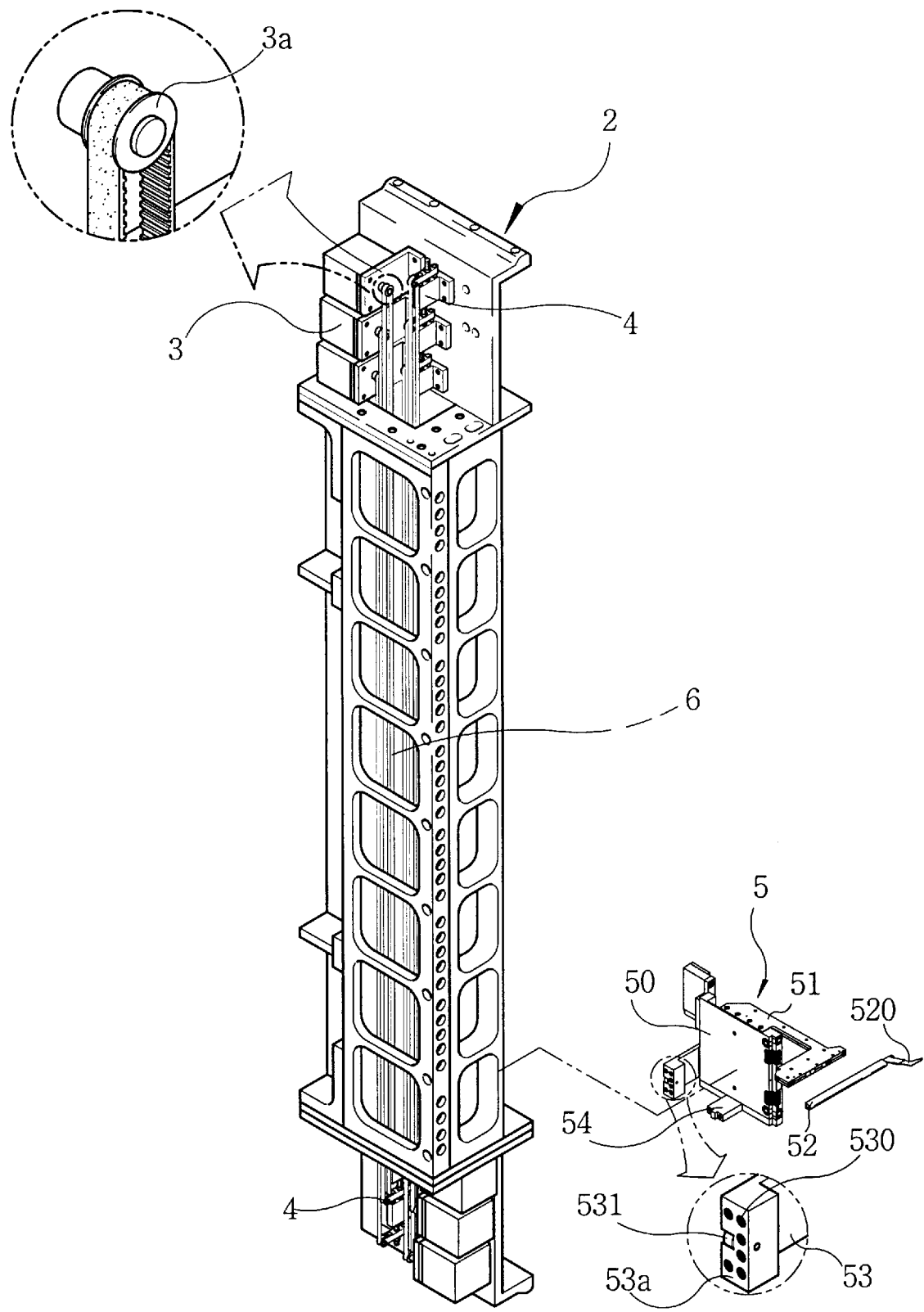
FIG. 2 is a perspective view illustrating a feeding base in which a test pin unit for a PCB test device is engaged according to an embodiment of the present invention.
Figure 3:
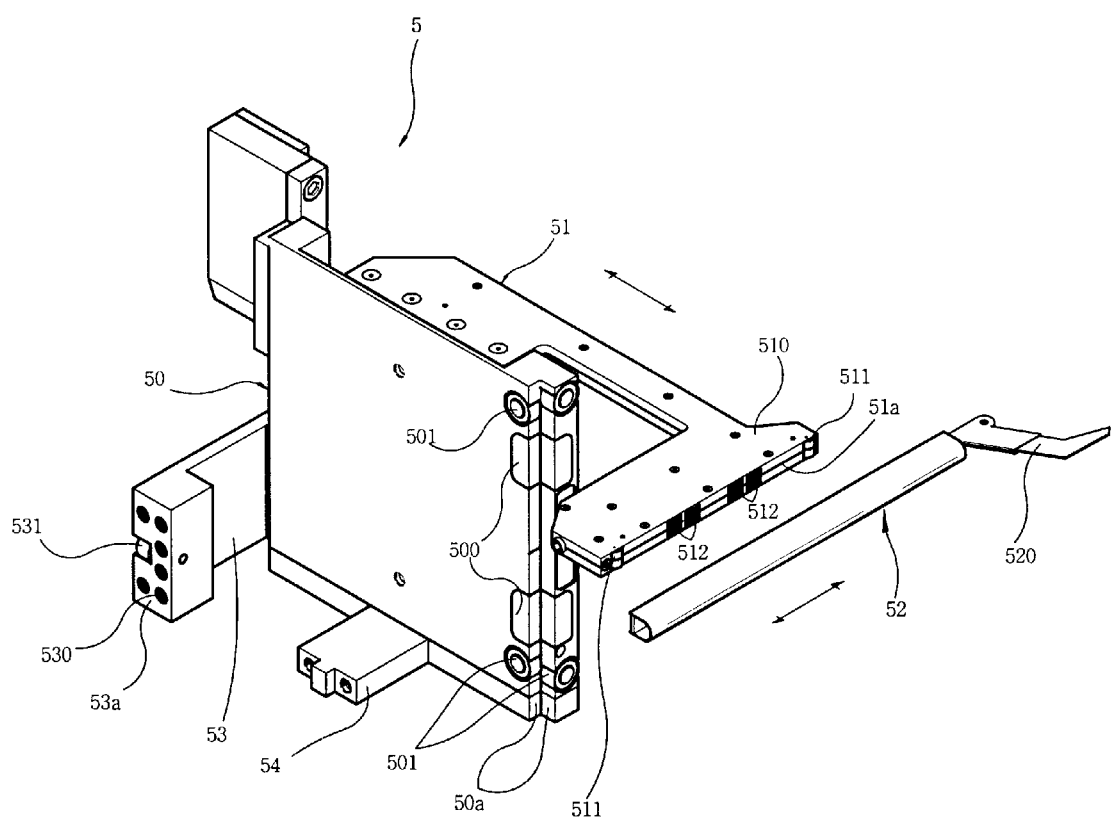
FIG. 3 is an enlarged perspective view illustrating a test pin unit for a PCB test device according to an embodiment of the present invention.

FIG. 1 is a plan view illustrating a test pin unit feeding device for a PCB test device according to an embodiment of the present invention, FIG. 2 is a perspective view illustrating a feeding base in which a test pin unit for a PCB test device is engaged according to an embodiment of the present invention, and FIG. 3 is an enlarged perspective view illustrating a test pin unit for a PCB test device according to an embodiment of the present invention.

As shown in FIG. 1, the feeding device of the PCB test pin unit according to an embodiment of the present invention includes a support base 1 which includes upper and lower horizontal rails which are disposed in parallel in the upper and lower portions, a feeding base 2 which is horizontally movable along the rails 1a and 1b of the support base 1, a feeding unit which includes a feeding motor 7 installed in the support base at one side of the feeding base and a feeding base belt 9 attached to the feeding base 2 and drivingly connected with the feeding motor 7 for feeding the feeding base 2 in a certain direction, six electric motors 3 in which three motors are installed in the upper and lower portions of the feeding base 2, respectively, six rollers 4 in which three rollers 4 are installed to correspond with each electric motor 3 on the feeding base 2 opposite to the electric motor 3, and six-stripe test pin unit feeding belt 9 having both ends connected with an electric gear 3a of the electric motor 3 and the rollers 4 corresponding to the electric gear 3a and including a test pin unit 5 installed at an intermediate portion of the same.

In the above construction, the feeding base 2 is horizontally moved by a guide of a guide rod 11 installed in the rails 1a and 1b of the support base. In addition, the belt 9 contacted with the upper and lower portions of the feeding base 2 for horizontally moving the feeding base 2 is connected with the driving rod 8 extended from a driving shaft of the feeding motor 7 and a tension force adjusting member 10 opposite to the feeding motor 7. The tension force of the feeding base belt 9 is adjusted by the tension force adjusting member 10, and the feeding base belt 9 is horizontally stably moved by the feeding motor 7 for thereby feeding the feeding base 2 is the horizontal direction.

Figure 4:
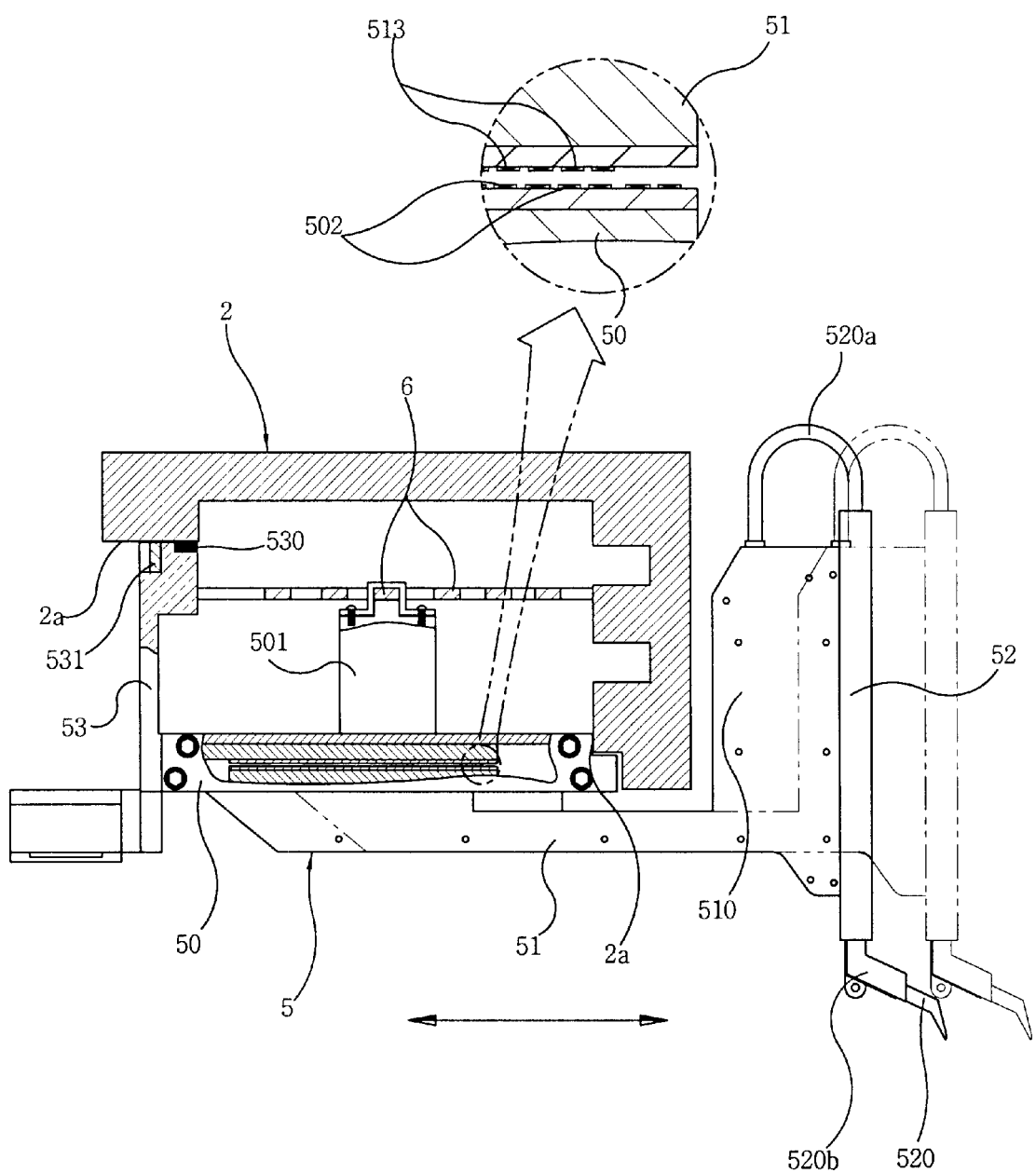
FIG. 4 is a cross-sectional view taken along line IV—IV of FIG. 1.

Six electric motors 3 installed in the upper and lower portions of the feeding base 2 by three motors are installed opposite to each other for thereby enhancing a space efficiency of the feeding base 2 and are installed in the feeding base 2 in such a manner that the belts 6 connected to each electric motor 3 are not interfered each other in a vertical direction at a certain distance therebetween. In addition, as shown in FIG. 2, the test pin unit feeding belt 6 is connected with the electric gear 3a of the electric motor 3 and the opposite roller 4 corresponding thereto. As shown in FIG. 3, in the test pin unit 5, a sliding plate 3 having a sliding surface 53a in which a permanent magnet 530 and a roller 531 are embedded in one side of the body 50 is integrally formed. A sliding surface 50a in which the permanent magnet 500 and the roller 501 are embedded are formed in the other side corner of the body 50. As shown in FIG. 4, the test pin unit 5 is attached to the rail 2a of the feeding base 2 by a pulling force of the permanent magnets 530 and 500 of each sliding surface 53a and 50a. Therefore, the test pin unit 5 stably slides in the upper and lower directions along the rail 2a of the feeding base 2 together with the belt 6 by the electric motor 3.

In the above-described feeding device of the PCB test pin unit according to an embodiment of the present invention, in the case that the feeding device is mounted in the PCB test device, as shown in FIG. 1, the feeding motor 7 and the electric motor 3 which are driven based on a certain program stored in the test device based on the PCB 100 which is a tested object fixed by a clamp 12 in the interior of the support base 1 feed the feeding base 2 and the test pin unit 5 in the horizontal direction, respectively, so that the test pin unit 5 applies an electric signal to a certain contact point of the PCB 100 using the test pin 520.

In the feeding device of the PCB test pin according to an embodiment of the present invention in the test process using the test device of the PCB, a plurality of test pin units 5 are quickly moved at the same time with respect to each contact point of the PCB 100 using the belts 6 and 9 based on the feeding motor 7 and the electric motor 3, so that it is possible to implement a test with respect to many contact points of the PCB 100, and the test is quickly performed with respect to the next contact points for thereby enhancing a test efficiency of the test device of the PCB.

As shown in FIG. 2, the test pin unit 5 according to an embodiment of the present invention is installed movably in the upper and lower directions on the feeding base 2 which is moved on the support base 1 in the horizontal direction. As shown in FIG. 1, the fixing member 54 engaged to the body 50 is fixed by the belt 6 of the feeding base 2, so that the fixing member 54 is moved in the upper and lower directions along the feeding base 2 based on the electric motors 3 installed in the upper and lower portions of the feeding base 2 which is driven based on an electric signal of a certain program.

As shown in FIG. 3, the test pin unit 5 includes a square plate shaped body 50, a moving body 51 which is installed in the body 50 and is movable in the horizontal direction, and a moving member 52 which is movable in the horizontal direction on the sliding surface 51a of the moving body 51.

The body 50 is moved in the vertical direction by the belt 6 on the feeding base 2. A fixing member 54 is installed in an intermediate center lower portion of the body 50 and is driven by the belt 6 for thereby moving the body 50 by the belt 6. Sliding surfaces 53a and 50a are installed at both sides and are contacted with the rail 2a formed in the feeding base 2 in the vertical direction for thereby guiding the movement of the body 50. The permanent magnets 530 and 500 and the rollers 531 and 501 attaching the body 50 to each rail 2a of the feeding base 2 are embedded in each sliding surface 53a and 50a. The body 50 is slidable with respect to the feeding base 2 along the rail 2a since each sliding surface 53a and 50a are attached to the rail 2a of the feeding base 2 based on a pulling force of the permanent magnets 530 and 500. The fixing member 54 is engaged to the belt 6 which is driven by the electric motor installed in the upper and lower portions of the feeding belt 2, so that a vertical movement is implemented along the feeding base 2. At this time, the rollers 531 and 501 of the sliding surfaces 53a and 50a decrease the friction force with respect to the rail 2a of the feeding base 2, so that the body 50 is more stably moved.

In the test pin unit 5 according to the present invention, the sliding surfaces 53a and 50a of the body 50 are formed based on the distance between the body 50 and the rail 2a of the feeding base and the shape of the same, and the left sliding surface 53a is formed on an end portion of the sliding plate 53 attached to one side of the body 50, and the right sliding surface 50a has an angle shaped cross section.

Figure 5:
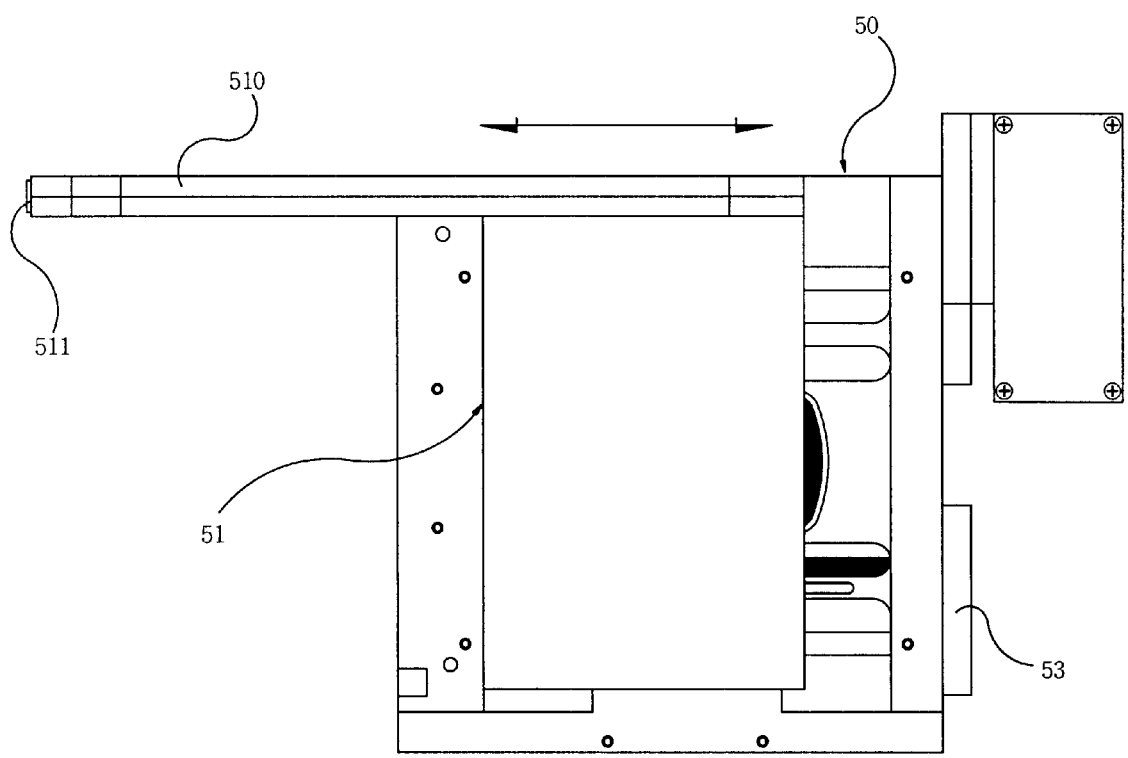
FIG. 5 is a rear view of FIG. 3.

As shown in FIGS. 3 and 5, the moving body 51 is movable in the horizontal direction in the rear surface of the body 50 and includes a fixing member 510 extended to the outside of the body 50. The fixing member includes a sliding surface 51a formed at the end portion of the same in the direction of the PCB 100, namely, in the direction diagonal to the moving direction of the fixing member. The rollers 511 are embedded in the front and rear portions of the sliding surface 51a, and two electromagnets 512 are embedded between two rollers 511.

The moving body 51 is moved in the horizontal direction with respect to the body 50. As shown in FIG. 4, the movement of the moving body 51 is controlled by a first moving control unit formed of a plurality of electromagnets 502 embedded in the body 50 at a certain distance therebetween and a plurality of permanent magnets 513 arranged in such a manner that magnetic poles of the same are alternately formed. Namely, the moving body 51 is moved in the horizontal direction in such a manner that the magnetic poles of the electromagnets 502 embedded in the body 50 are alternately changed by the power applied based on a certain program, and a certain pulling and repelling force are alternately formed with respect to the permanent magnets.

Figure 6:
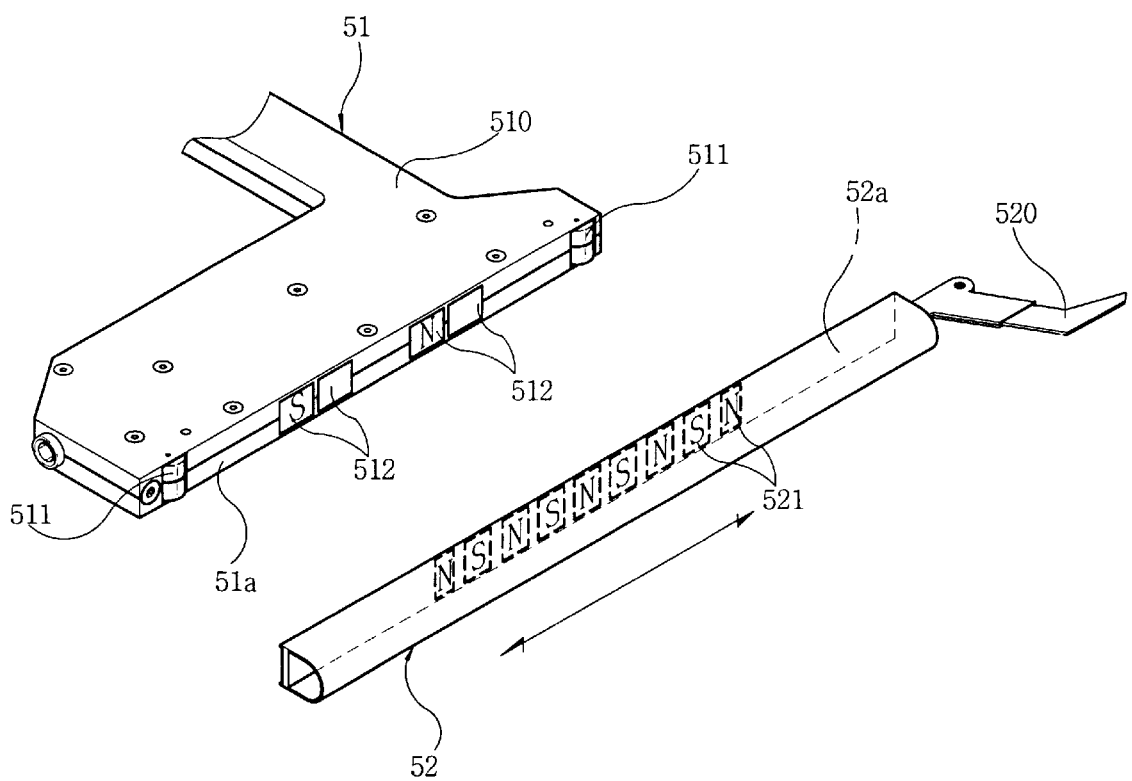
FIG. 6 is a perspective view illustrating a test pin of a test pin unit for a PCB test device according to an embodiment of the present invention.
Figure 7:
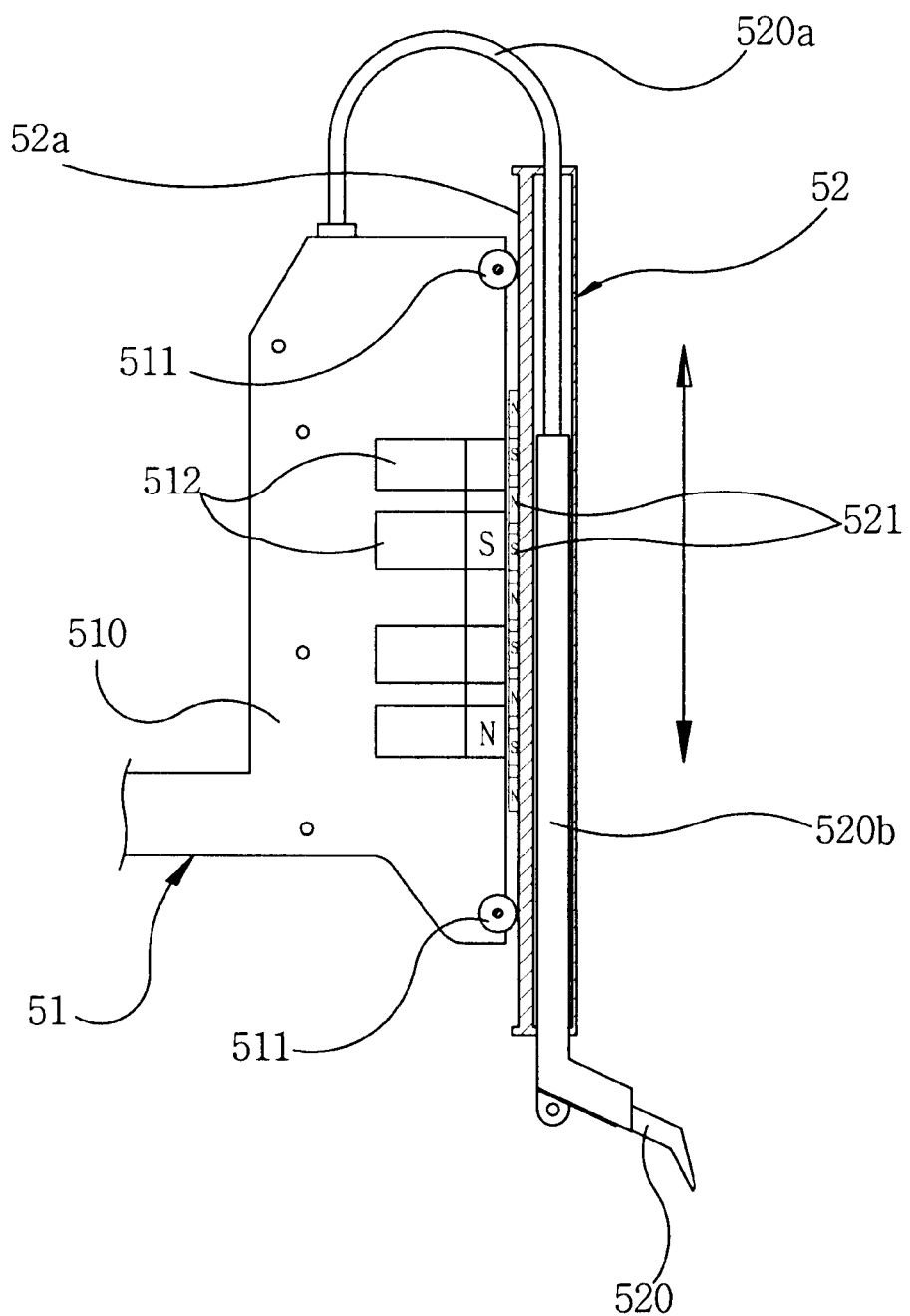
FIG. 7 is a plan view of FIG. 6.

As shown in FIGS. 6 and 7, the moving member 52 is a rod shaped pipe attached to the sliding surface 51a of the moving body 51 and slides by a second moving control unit formed of an electromagnet 512 embedded in the sliding surface 51a of the moving body 51 and a plurality of permanent magnets 521 attached to a surface contacting with the sliding surface 51a, and the test pin 520 engaged to the end portion contacts with a certain contact point of the PCB 100 along the sliding surface 51a. Namely, a plurality of permanent magnets 521 which have a pulling and repelling force with respect to the electromagnet 512 of the sliding surface 51a of the moving body 51 are attached to the surface 52a of the moving member 52 contacting with the sliding surface 51a of the moving body 51. The permanent magnets 512 are arranged in such a manner that the magnetic poles of the same are alternately formed, so that a pulling and repelling force are sequentially generated from the electromagnets 512 of the moving body in which the magnetic poles are alternately changed based on a certain electric signal, so that the moving member 52 is moved along the sliding surface 51a of the fixing member 510. The test pin 520 engaged at one end contacts or does not contact with a certain contact point of the PCB 100.

In the drawings, reference numerals 520a and 520b are cable and conductive pipe for applying a power of the moving body 51 to the test pin 520 through the body 50.

In the case that the PCB test pin unit is adapted to the PCB test device according to the present invention, as shown in FIG. 1, the feeding base 2 is moved in the horizontal direction by the feeding motor 7 driven by an electric signal inputted into a feeding device, namely, a test device based on a set program with respect to the substrate 100 fixed by the clamp 12 in the interior of the support base 1 and is moved in a vertical direction by the electric motor 3, so that it is moved to a certain place of the PCB 100. In addition, as shown in FIG. 4, the moving body 51 is moved by the electromagnets 502 and the permanent magnet 513 embedded in the first moving control units 506 and 513, namely, the body 50 without a coordinate movement at the current position, so that it is possible to feed the test pin within a certain range, and it is possible to contact the test pin 520 with multiple contact points multiple times at every feeding operation. Therefore, the test pin unit 5 is capable of testing multiple contact points formed around the test pin 520 whenever the feeding operation is performed by the feeding device. Therefore, in the present invention, it is possible to significantly decrease the feeding number of the test pin units based on the feeding device which is adapted for the PCB test, and it is possible to significantly increase the test efficiency of the PCB test device.

As described above, in the PCB test pin unit according to the present invention is capable of contacting the test pin with multiple contact points based on a self-moving coordinate within a certain range as a moving body whenever the feeding operation is performed.

The test pin unit feeding device for feeding the test pin unit according to the present invention feeds the feeding base in the horizontal direction and fast feeds multiple test pin units in the vertical direction using the belts installed in the feeding base for thereby quickly feeding a plurality of test pin units in the vertical direction.

Therefore, the test pin unit for the PCB test device according to the present invention is capable of significantly decreasing the feeding number of the test pin units which is adapted for the PCB substrate test. In addition, in the case of the feeding device of the test pin unit according to the present invention is capable of significantly increasing the numbers of the test pin units and enhancing the feeding speed, so that it is possible to enhance the test speed of the PCB test device and the test efficiency.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A test pin unit for a PCB (Printed Circuit Board) test device, comprising:
    a body joined with a feeding device, including a sliding surface formed with a permanent magnet and a roller so that the sliding surface is contacted with a vertical rail of a feeding base which is fed in a horizontal direction with respect to the PCB;
    a moving body, joined with the body, which slides in a horizontal direction with respect to the PCB;
    a first movement control means for controlling the moving body with respect to the body;
    a moving member joined with the moving body, which slides toward the PCB and applies an electrical signal through a test pin; and
    a second movement control means for controlling the moving member with respect to the moving body.

2. The test pin unit of claim 1, wherein said first movement control means includes:
    a plurality of permanent magnets each having a magnetic pole, embedded in the moving body, which are arranged in a manner of sequentially changing magnetic poles; and
    a plurality of electromagnets each having a magnetic pole, embedded in the body, which are arranged corresponding with the permanent magnets, so that the moving body is controlled by changing the magnetic poles of the electromagnets.

3. The test pin unit of claim 1, wherein said second movement control means includes:
    a plurality of permanent magnets each having magnetic poles, embedded in the moving member, which are arranged in a manner of sequentially changing magnetic poles; and
    a plurality of electromagnets each having a magnetic pole, embedded in the moving body, which are arranged corresponding with the permanent magnets, so that the moving body is controlled by changing the magnetic poles of the electromagnets.

4. The test pin unit of claim 1, wherein said moving body and the moving member includes a roller embedded in a sliding surface for promoting a sliding movement of the moving body and the moving member.

* * * * *